(12) United States Patent
Koike et al.

(10) Patent No.: US 6,975,024 B2
(45) Date of Patent: Dec. 13, 2005

(54) HYBRID INTEGRATED CIRCUIT DEVICE AND MANUFACTURING METHOD THEREOF

(75) Inventors: Yasuhiro Koike, Gunma (JP); Hidefumi Saito, Gunma (JP); Katsumi Okawa, Gunma (JP); Junichi Iimura, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/183,758

(22) Filed: Jun. 27, 2002

(65) Prior Publication Data

US 2003/0003629 A1 Jan. 2, 2003

(30) Foreign Application Priority Data

Jun. 28, 2001 (JP) .................................. P. 2001-196985
Jun. 28, 2001 (JP) .................................. P. 2001-196986

(51) Int. Cl.⁷ ............................................. H01L 23/02
(52) U.S. Cl. ..................... 257/678; 257/723; 257/724; 257/725; 257/787; 257/789; 257/795
(58) Field of Search ................... 257/678, 795, 257/787, 789, 723, 724, 725

(56) References Cited

U.S. PATENT DOCUMENTS

| 4,822,550 A | 4/1989 | Komathu |
| 6,157,086 A | 12/2000 | Weber |
| 6,321,734 B1 | 11/2001 | Kaminaga et al. |
| 2002/0074652 A1 | 6/2002 | Pierce |

FOREIGN PATENT DOCUMENTS

JP    H11-330317    11/1999

*Primary Examiner*—Richard Elms
*Assistant Examiner*—Doug Menz
(74) *Attorney, Agent, or Firm*—Fish & Richardson P.C.

(57) ABSTRACT

In a manufacturing method of a hybrid integrated circuit device of the invention, transfer molding is carried put by positioning a curved surface formed in a back surface of the substrate on a lower mold die side and a burr formed in a main surface of the substrate on an upper mold die side. This utilizes the curved surface to inject thermosetting resin in an arrow direction to pour the thermosetting resin through a below of the substrate. There are no broken fragments of burr in a thermosetting resin at the below of the substrate. As a result, a required minimum resin thickness is secured at the below of the substrate, thus realizing a hybrid integrated circuit device having a high voltage resistance, an excellent heat dissipation property and a high product quality.

22 Claims, 16 Drawing Sheets

| THERMOSETTING RESIN | CONVENTIONAL | PRESENT INVENTION |
|---|---|---|
| MATERIAL | | |
| SILICA AMOUNT | 1 | 0.6 – 0.8 |
| SILICA FORM | FRAGMENTS | SPHERICAL |
| ION-TRAPPING AGENT | ABSENT | PRESENT |
| PROPERTIES | | |
| SPIRAL FLOW (IN TRANSFER MOLDING) [ cm ] | 40 – 60 | 80 – 120 |
| MELT VISCOSITY (IN TRANSFER MOLDING) [ Pa·s ] | 40 – 60 | 4 – 10 |
| GLASS TRANSFER TEMPERATURE [ °C ] | 140 – 160 | 140 – 160 |
| THERMAL CONDUCTIVITY [ W/m·°C ] | 1.5 – 2.5 | 1.0 – 2.0 |

HYBRID INTEGRATED CIRCUIT DEVICE AND MANUFACTURING METHOD THEREOF

BACKGROUND OF THE INVENTION

The present invention relates to a hybrid integrated circuit device and manufacturing method thereof, and more particularly to a hybrid integrated circuit device having a resin seal body formed on a hybrid integrated circuit substrate by transfer molding and to a manufacturing method thereof.

Generally, there are, principally, two methods of sealing employed for hybrid integrated circuit devices.

The first method employs member having such a form as placing a lid, generally called a case member, on a hybrid integrated circuit substrate mounted with circuit elements of semiconductor chips or the like. This structure includes a hollow structure or that having a resin separately filled therein.

The second method is injection molding as a process to mold semiconductor ICs. This is described, e.g. in Japanese Patent Publication No. H11-330317. The injection molding generally uses thermoplastic resin. For example, the resin heated at 300° C. is injected under a high injection pressure and poured into a mold at one time, whereby the resin is molded. Since a resin polymerization time is not required after pouring a resin into a mold, there is a merit to shorten the operation time as compared with transfer molding.

Explanation will be made on a method of manufacturing a conventional hybrid integrated circuit device using injection molding, with reference to FIGS. 13 to 16C.

First, an aluminum (hereinafter, referred to as Al) substrate 1 is employed as a metal substrate as shown in FIG. 13, in order for explanation.

The Al substrate 1 is anodized in its surface. Furthermore, a resin 2 having an excellent insulation property is formed on the entire surface of the anodized Al substrate 1. However, the oxide may be omitted where voltage resistance is not taken into consideration.

On the resin 2, a conductive path 3a is formed by a Cu foil 3. On the conductive path 3a, an active element 5 such as a power transistor, transistor or IC, and a passive element 36 such as a chip resistor or chip capacitor, are mounted through a solder 40. Thus, a predetermined circuit is realized. Herein, by providing electrical connection using an Ag paste or the like, soldering may be partly omitted. In the case of mounting face up an active element 5, such as a semiconductor chip, connection is through a metal fine wire 7 formed by bonding. Further, an outer lead 8 is connected with an external electrode terminal 11 and is exposed from the resin sial body 10 to exterior.

Herein, the thermoplastic resin adopted is a resin called PPS (polyphenyl sulfide).

The injection temperature of thermoplastic resin is as high as 300° C. Consequently, there is a problem that solder 12 be fused by the hot resin thereby causing poor soldering. For this reason, an overcoat 9 is formed by potting a thermosetting resin (e.g. epoxy resin) in a manner previously covering solder joints, metal fine wires 7, active elements 5 and passive elements 6. Due to this, the fine wires (approximately 30–80 μm) particularly are prevented from being fallen down and broken under an injection resin pressure during forming with a thermoplastic resin.

As shown in FIGS. 16B and 16C, a resin seal body 10 is formed by a support member 10a and a thermoplastic resin.

Namely, a substrate 1 mounted on the support member 10a is covered with thermoplastic resin by injection molding. The support member 10a and the thermoplastic resin have an abutment region. The abutment region of support member 10a is fused by the poured hot thermoplastic resin, thereby realizing a full-mold structure as shown in FIG. 13.

Next, explanation will be made on a conventional method of manufacturing a hybrid integrated circuit device using injection molding, with reference to FIGS. 14 to 16C.

FIG. 14 is a flowchart, including a metal substrate preparing process, an insulating layer forming process, a Cu foil pressure-laying process, a partial Ni plating process, a Cu foil etching process, a die bonding process, a wire bonding process, a potting process, a lead connection process, a support member attaching process, an injection mold process and a lead cutting process.

FIGS. 15A to 16C show the sectional views of the processes. Note that the processes, that are apparent without showing, are omittedly shown.

At first, FIGS. 15A and 15B show a metal substrate preparing process, an insulating layer forming process, a Cu foil pressure-laying process, a partial Ni plating process and a Cu foil etching process.

In the metal substrate preparing process, prepared is a substrate in consideration of its property of heat dissipation, substrate strength, substrate shield and the like. This example uses an Al substrate 1 having a thickness, e.g. of approximately 1.5 mm, excellent in heat dissipation property.

Next, a resin 2 excellent in insulation property is further formed over the entire surface of the aluminum substrate 1. On the insulating resin 2, a Cu conductor foil 3 is pressure-laid to constitute a hybrid integrated circuit. On the Cu foil 3, an Ni plating 4 is provided over the entire surface in consideration of adhesion to a metal fine wire 7 electrically connecting between the Cu foil 3 as a lead-out electrode and an active element 5.

Thereafter, a known screen-printing is used to form Ni plating 4a and a conductive path 3a.

Next, FIG. 15C shows a die bonding process and a wire bonding process.

On the conductive path 3a formed in the preceding process, an active element 5 and a passive element 6 are mounted through a conductive paste such as a solder paste 12, thereby realizing a predetermined circuit.

Next, FIGS. 16A and 16B show a potting process, a lead connection process and a support member attaching process.

As shown in FIG. 16A, in the potting process, prior to a later injection mold process, potting is previously made with a thermosetting resin (e.g. epoxy resin) onto the solder junctions, metal fine wires 7, active elements 5 and passive elements 6, thereby forming an overcoat 9.

Next, prepared is an outer lead 8 for outputting and inputting signals from and to the hybrid integrated circuit. Thereafter, the outer lead 8 is connected to the external connection terminal 11 formed in a peripheral area of the substrate 1 through a solder 12.

Next, as shown in FIG. 16B, the hybrid integrated circuit substrate 1 connected with the outer lead 8 and the like is mounted on a support member 10a. By mounting the substrate 1 on the support member 10a, it is possible to secure a thickness of a resin seal body at a backside of the substrate 1 during injection molding as explained in the next process.

Next, FIG. 16C shows an injection mold process and a lead cutting process.

As shown in the figure, after potting is done with a thermosetting resin on the substrate 1 to form a overcoat 9, a resin seal body 10 is formed by injection molding. At this time, in the abutment region between the support member 10a and the thermoplastic resin, the abutment region of the support member 10a is fused by the injected hot thermoplastic resin and turned into a full-mold structured resin seal body 10.

Finally, the outer lead 8 is cut to a use purpose thereby adjusting the length of the outer lead 8.

By the above process, a hybrid integrated circuit device is completed as shown in FIG. 13.

On the other hand, in the semiconductor industry, it is a general practice to carry out a transfer mold process. In a hybrid integrated circuit device by the conventional transfer molding, a semiconductor chip is fixed on a leadframe, e.g. of Cu. The semiconductor chip and the lead are electrically connected through a gold wire (hereinafter, referred to as Au). This is because the impossibility of employing an Al fine wire in respect of its less elasticity and ready bendability and time-consumed bonding requiring ultrasonic waves. Consequently, there has not conventionally existed a hybrid integrated circuit device that is formed by one metal plate to have a circuit formed thereon and further the substrate wire-bonded by Al fine wires is directly transfer-molded. Further, as well as a printed circuit board and a ceramic substrate, there has not conventionally existed a hybrid integrated circuit device having a substrate wire-bonded by Al fine wires directly transfer-molded.

As shown in FIG. 13, in the conventional hybrid integrated circuit device formed by transfer molding, a resin seal body 10 is formed by injection molding after a hybrid integrated circuit substrate 1 is mounted on a support member 10a. Consequently, the insulating region at the below of the substrate 1 can be easily controlled to a thickness of approximately 0.5–1.0 mm, for example. Meanwhile, because the resin seal body 10 is formed after placing the substrate 1 on the support member 10a, it is not problematic whether the substrate 1 is punched out at the main surface or back surface.

However, when a resin seal body is directly formed over the hybrid integrated circuit substrate by transfer molding, there are cases that the burr formed is broken during transfer molding at a time of punching out the substrate. The fragments of burr will be contained in a resin seal body formed at the below of the substrate. Due to this, circuit voltage is applied onto the substrate, a high voltage of which is to be applied to the resin seal body at the below of the substrate. Thus, there has been a problem that the reliability on voltage resistance is unavailable on the resin seal body containing substrate burrs.

Furthermore, in a hybrid integrated circuit device of a injection mold type, there is a need to prevent a metal fine wire 7 from being bent or broken under an injection pressure upon molding, or to prevent a solder 12 from flowing at the temperature during injection molding. For this reason, the conventional structure shown FIG. 13 has adopted a potted overcoat 9 in order to cope with the above problem.

However, potting is made with a thermosetting resin (e.g. epoxy resin) to form an overcoat 9, and thereafter injection molding is carried out. Accordingly, there is a problem of requiring material and operation cost in concerned with such thermosetting resin.

Meanwhile, in the conventional hybrid integrated circuit device by transfer molding, a semiconductor chip or the like is fixed on an island. Although the heat generated by the semiconductor chip or the like dissipates through a fixing region, there has been a problem that there is restriction in heat dissipation area thus resulting in poor heat dissipation.

Furthermore, as noted above, the Al fine wire is readily bent due to the causes of being ultrasonically bonded to have a weak neck and further less resistive to resin injection pressure because of its low elastic modulus. For this reason, it is a practice to use, as a metal fine wire, an Au wire resistive to resin injection pressure in the wire-bonding for a resin seal body. The transfer molding employing an Al wire is not in the current practice. It is, therefore, a problem of the present invention to provide a structure and manufacturing method realizing the transfer molding free from bending by actively employing such an Al fine wire.

SUMMARY OF THE INVENTION

The present invention has been made in view of the foregoing conventional problem. A hybrid integrated circuit device of the invention comprises: a conductive pattern provided at least on a surface of a hybrid integrated circuit substrate; a semiconductor or passive element mounted on the conductive pattern; an aluminum fine wire electrically connecting between the semiconductor or passive element and the conductive pattern; a lead connected to the conductive pattern and extended as an output or input to an outside; and a thermosetting resin integrally covering the substrate by transfer molding; wherein a blanking surface is arranged in a bottom surface of said substrate.

Meanwhile, a hybrid integrated circuit device of the invention comprises: a conductive pattern provided at least on a surface of a hybrid integrated circuit substrate; a semiconductor or passive element mounted on the conductive pattern; an aluminum fine wire electrically connecting between the conductive pattern and the semiconductor or passive element; a lead connected to the conductive pattern and extended as an output or input to an outside; and a thermosetting resin covering at least a surface of the substrate by transfer molding; wherein the thermosetting resin contains a filler having a spherical form, the thermosetting resin having a low viscosity and a fluidity.

In order to solve the foregoing problem, a method of manufacturing a hybrid integrated circuit device comprises: a step of preparing a hybrid integrated circuit substrate insulation-treated at least in a surface thereof; a step of forming a conductive pattern on the substrate; a step of mounting a semiconductor or passive element on the conductive pattern; a step of blanking the substrate at a back surface thereof; a step of electrically connecting between the semiconductor or passive element and the conductive pattern by the use of an aluminum fine wire; a step of connecting the substrate with a lead extending as an output or input to an outside; and a step of integrally molding the substrate with a thermosetting resin by transfer molding.

Meanwhile, a method of manufacturing a hybrid integrated circuit device has the processes of: preparing a hybrid integrated circuit substrate having a semiconductor or passive element provided on a conductive pattern on a surface at least insulation-treated, the conductive pattern and an aluminum fine wire being in electric connection; and molding a thermosetting resin containing a filler having a spherical form, a low viscosity and a fluidity to at least a surface of the substrate mounting a lead by transfer molding.

DETAILED DESCRIPTION OF THE PREFERRED EMBODIMENT

Figure 1A:
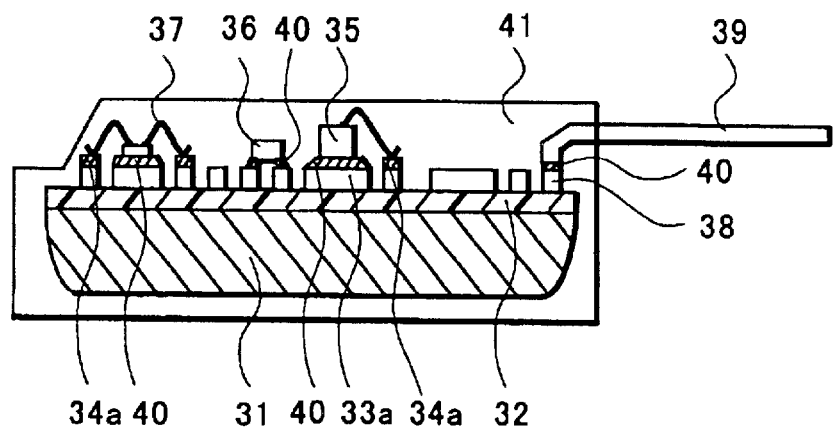
FIG. 1A is a sectional view explaining a hybrid integrated circuit device of the present invention.
Figure 2A:
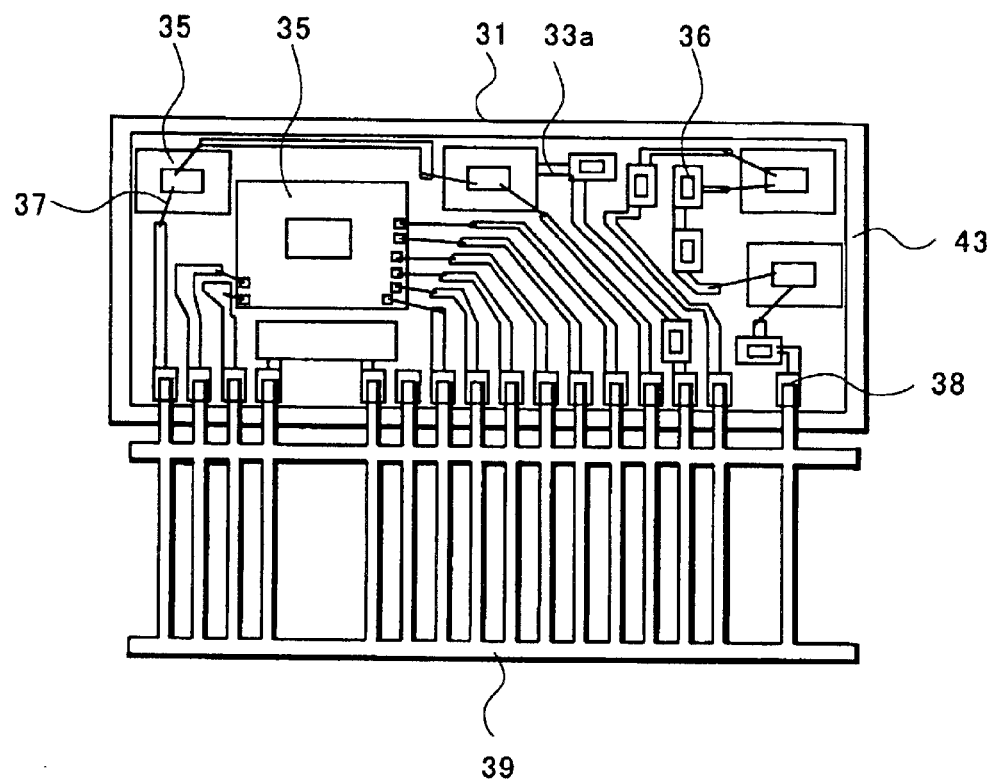
FIG. 2A is a plan view explaining the hybrid integrated circuit device of the invention.
Figure 2B:
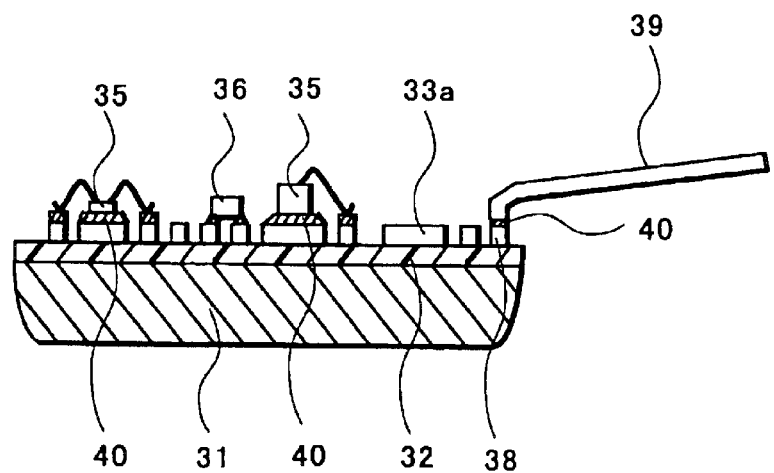
FIG. 2B is a sectional view thereof.

Explanation will be now made on a hybrid integrated circuit device according to a first embodiment of the invention with reference to FIGS. 1A (sectional view) and 1B (plan view), and FIGS. 2A and 2B.

As shown in FIG. 1A, a hybrid integrated circuit substrate 31 employs a substrate excellent in heat dissipation property in consideration of the heat generation of from the semiconductor chips fixed on the substrate 31. This embodiment explains a case using an aluminum substrate 31. Note that, although the substrate 31 in the embodiment uses an aluminum (hereinafter, referred to as Al) substrate, this is not necessarily limited to. For example, the embodiment is to be realized in case the substrate 31 uses a printed substrate, a ceramic substrate, a metal substrate or the like. The metal substrate may use a Cu substrate, an Fe substrate, an Fe—Ni substrate, an AlN (aluminum nitride) substrate or the like.

The substrate 31 is anodized in its surface, to further form an insulating resin 32 excellent in insulation, e.g. epoxy resin, over the entire surface thereof. Note that this metal oxide may be omitted without problem where voltage resistance is not considered.

On the resin 32, a conductive path 33a is formed by a Cu foil 33 (see FIG. 7). An epoxy resin, for example, is overcoated to protect the conductive path 33a on the substrate 31 by screen-printing. On the conductive path 33a, an active element 35 such as a power transistor, small-signal transistor or IC, and a passive element 36 such as a chip resistor or chip capacitor, are mounted through a solder 40. Thus, a predetermined circuit is realized. Herein, by providing electrical connection using an Ag paste or the like, soldering may be partly omitted. In the case of mounting face up an active element 35, such as a semiconductor chip, connection is through a metal fine wire 37. For a power semiconductor chip, the metal fine wire 37 uses an Al wire having approximately 150–500 $\mu m\phi$, for example. This is generally called a thick wire. For a semi-power or small-signal semiconductor chip, used is an Al wire having approximately 30–80 $\mu m\phi$, for example. This is generally called a fine wire. An external connection terminal 38, in a peripheral area of the substrate 31, is connected with an outer lead 39 of Cu or Fe—Ni through a solder 40.

According to the present invention, a resin seal body is directly formed over active element 35, a passive element 36 and Al wires 37 and the like on the hybrid integrated circuit substrate 31.

Namely, in the resin seal body 41, the thermosetting resin for use in transfer molding has a low viscosity and a cure temperature lower than a melting point of the brazing material 40 (e.g. solder) used in the connection member, e.g. 183° C. This can eliminate the overcoat 9 formed by potting a thermosetting resin (e.g. epoxy resin) required on the conventional hybrid integrated circuit device shown in FIG. 13.

As a result, in case thermosetting resin is poured directly over the Al fine wire having a diameter, e.g. of approximately 40 $\mu m$, electrically connecting the small-signal IC or the like to the conductive path 33a during transfer molding, there is no possibility of falling down, disconnection or bending. A feature of the present invention is that the Al fine wire is prevented from being bent during the molding process.

Figure 1B:
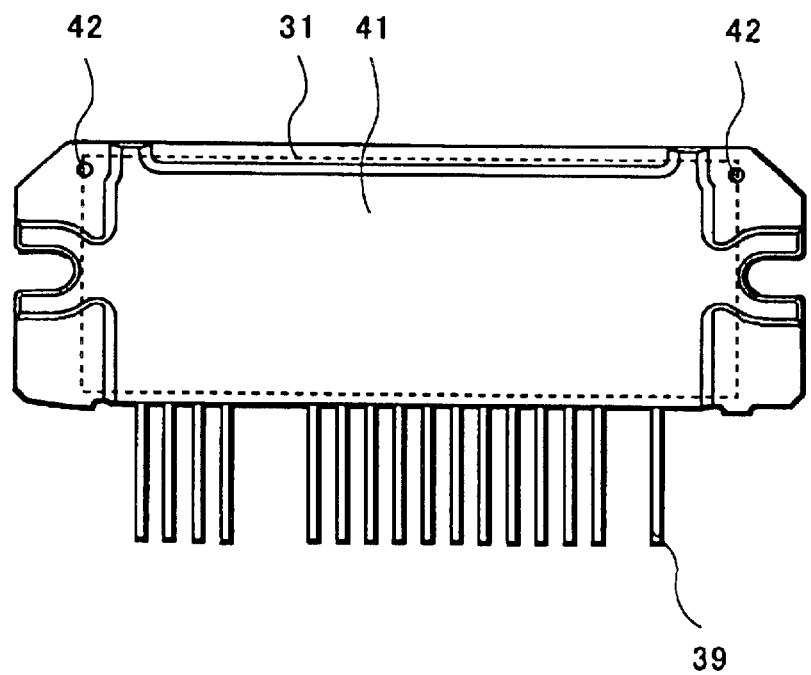
FIG. 1B is a plan view thereof.

As shown in FIG. 1B, the outer leads 39 extend externally of the resin seal body 41. The outer leads 39 are adjusted in length in compliance with the purpose of use. Holes 42 are formed as traces of pushpins in the resin seal body 41, at two points close to a side opposite to a side the outer leads 39 extend. The holes 42 are caused by pushpins 47 (see FIG. 9) fixing the substrate 31 during transfer molding, which are left even after forming a resin seal body 41.

Referring to FIG. 2A, the holes 42 are formed in a peripheral region 43 of the substrate 31, i.e. in a region not formed with a circuit or the like on the substrate 31. Furthermore, because the holes 42 are formed in the peripheral region of the substrate 31 over the resin film 32, it is structurally free from problem in respect of quality and moisture resistance. Herein, the peripheral region 43 is a margin provided to secure a distance from a circuit area upon individually pressing the substrate 31. In the event, the peripheral region 43 is a dead space, and the region is effectively used as a abutting region for the pin, thus there being a merit to effective use of mounting region.

As shown in FIGS. 2A and 2B, a conductive paths 33a is densely formed on the substrate 31. On the conductive path 33a, mounted are an active element 35 such as a power transistor, small-signal transistor or IC, and a passive element 36 such as a chip resistance or capacitance through a solder 40 or the like. Meanwhile, outer leads 39 are connected through external connection terminals 38, thereby realizing a predetermined circuit.

As shown in the figure, a complicated circuit is formed within a narrow space on the substrate 31. According to the hybrid integrated circuit device of the invention, after forming an insulating resin 32 over the entire surface of the substrate 31, a complicated circuit is formed and thereafter outer leads 39 are bonded to the substrate 31, followed by integrally, directly forming a resin seal body 41 by transfer molding.

Conventionally, it is a practice to use a leadframe completely blanked through both of the surfaces. This is true for the leadframe to be etched. With a leadframe completely worked through the both surfaces, it is possible to make a single-structured TR leadframe or IC leadframe. However, a complicated circuit cannot be formed, e.g. hybrid integrated circuit conductive pattern. Meanwhile, in a leadframe for transfer molding, when forming thereon a wiring as in FIG. 2A, there is a necessity of suspension leads fixing at various points in order to prevent lead warpage. In this manner, the hybrid integrated circuit using a usual leadframe can afford to mount thereon utmost several active parts. There is a limitation in forming a hybrid integrated circuit having a conductive pattern as in FIG. 2A.

Namely, by providing a structure of a hybrid integrated circuit device of the invention (structure supporting a conductive pattern on a metal substrate), a substrate 31 having a complicated circuit can be transfer-molded. Furthermore, because the invention uses, as the substrate 31, a substrate having a high thermal conductivity, the substrate 31 in the entirety can be utilized as a heat-sink to prevent the mounted elements from rising in temperature. Moreover, the heat generated is allowed to dissipate to the outside through the substrate 31. Accordingly, as compared to the semiconductor device using the conventional transfer-molded leadframe, heat dissipation property is excellent because the metal substrate 31 is directly molded, thus realizing circuit characteristic improvement and size reduction.

Figure 3:
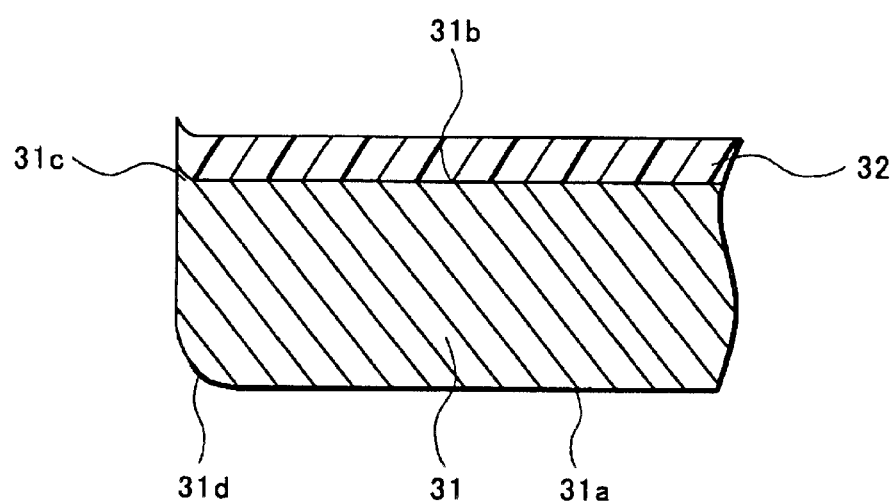
FIG. 3 is a sectional view explaining a blanking surface of a substrate in the hybrid integrated circuit device of the invention.

As shown in FIG. 3, the hybrid integrated circuit substrate 31 has a blanking surface 31a in a back surface and a conductive path 33a and the like formed on the opposite surface 31b. On the blanking surface 31a and the opposite surface 31b of the substrate, a curved surface 31d and a burr 31c are respectively formed upon blanking the substrate 31. The burr 31c is formed approximately 100 μm on a surface of the substrate 31 having a thickness of 1.5 mm, for example. The burr 31c is structurally weak in strength.

Herein, as shown in FIG. 1A, the hybrid integrated circuit device of the invention uses the surface 31b having a burr 31c as a surface of the hybrid integrated circuit substrate 31. Although the detail is referred later, the resin upon transfer molding is poured at the bottom of the substrate 31. This provides a structure that, despite the burrs 31 caused upon transfer molding are spotted, these are not present in a resin seal body 41 at the below of the substrate 31.

Meanwhile, although not shown in FIGS. 2A and 2B, circuit voltage is applied to the substrate. The hybrid integrated circuit is applied by a voltage, e.g. 500–700 V, wherein the equivalent voltage is applied to the substrate 31. Although the hybrid integrated circuit device is to be mounted and used on a chassis or the like, this in this case forms a parasitic capacitance at between the substrate 31, the resin seal body 41 and the chassis. In this case, in case there are burr 31c fragments in the resin seal body 41 at the below of the substrate 31, the burr 31c as a conductor material reduces the parasitic capacitance. This results in quality deterioration in the hybrid integrated circuit device.

However, as noted above, the hybrid integrated circuit device of the invention uses the surface 31b having a burr 31c as a surface of the hybrid integrated circuit substrate 31. This also is in a structure that the burrs 31c if fragmented upon transfer molding are spotted are not present in the resin seal body 41 at the below of the substrate 31. Due to this, the hybrid integrated circuit device of the invention has a resin thickness serving for high voltage resistance at the below of the substrate 31. This realizes a hybrid integrated circuit device excellent in product quality.

On the other hand, in the case of using the surface formed with the burr 31c as a back surface of the hybrid integrated circuit substrate 31, there is a possibility that the burr 31c is crushed by the resin flow of upon transfer molding to exist in the resin seal body 41 at the below of the substrate 31. Furthermore, the resin seal body 41 at the below of the substrate 31 has a thin-walled thickness of 0.5 mm, for example. Consequently, although the burr 31c is approximately 100 μm, the resin seal body 41 on the back surface of the substrate 31 cannot secure its thickness at the burr 31 region. Due to this, high voltage resistance is lost in the resin seal body 41 at the below of the substrate 31, particularly at the burr 31c, making impossible to secure product quality. As a result, the use of the surface 31b having the burr 31c as a surface of the hybrid integrated circuit substrate 31 realizes an excellent hybrid integrated circuit device.

Figures 4A, 4B:
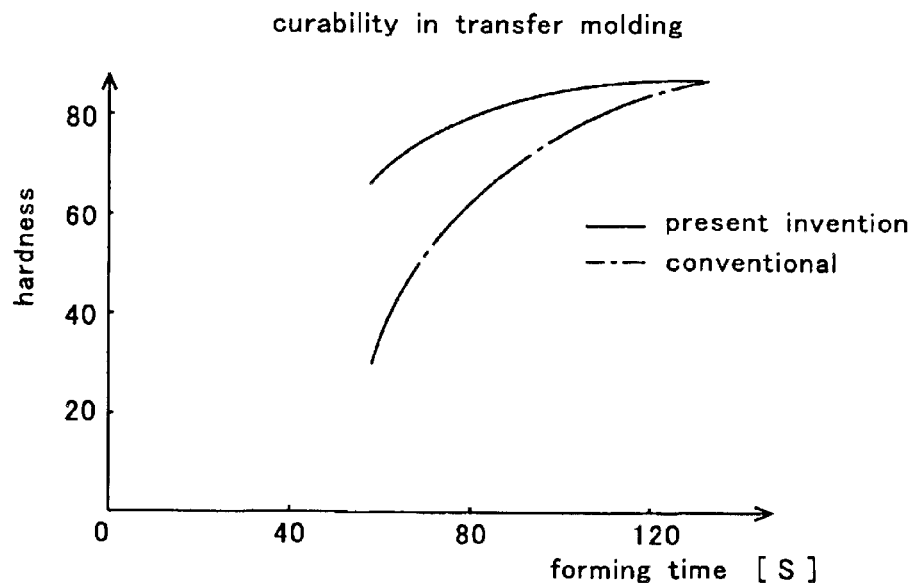
FIGS. 4A and 4B are a property table and figure explaining a thermosetting resin to be used for the hybrid integrated circuit device of the invention.

As shown in FIGS. 4A and 4B, according to the invention, the thermosetting resin forming a resin seal body 41 uses a resin low in viscosity but high in fluidity. For this reason, the thermosetting resin adopted was that called an epoxy resin mixture. The thermosetting resin has been developed by placing attentions to the following point.

First, because a thermosetting resin is directly molded to a metal fine wire 37, particularly Al wire having a diameter of approximately 40 μm, consideration is made on the effect of falling down the metal fine wire 37 or breakage in the metal fine wire 37.

Second, taking into account the dissipation of the heat generated by the hybrid integrated circuit including power transistors, etc. formed on the substrate 31 to the outside of the hybrid integrated circuit device through the substrate 31 and resin seal body 41, consideration is made on the thickness of the resin seal body 41 to be formed at the below of the substrate 31.

Third, consideration is made to shorten the operation time in forming a resin seal body 41 by transfer molding, i.e. resin injection time and post-forming standing time for stabilizing resin property.

Fourth, consideration is made on the voltage resistance and product reliability in use as a hybrid integrated circuit device for an application at high voltage resistance, e.g. 500–600 V.

The thermosetting resin of the invention will be explained with consideration to the above points. First, as shown in FIG. 4A, considered is a constituent material and property of the thermosetting resin. In the invention, silica is reduced in amount by about 20–40% as compared to the thermosetting resin in the conventional, in order to reduce the viscosity of the thermosetting resin. Specifically, the conventional has contained this approximately 2.0–2.5 g/cm$^3$ in thermosetting resin. The invention contains it approximately 1.0–1.5 g/cm$^3$ in thermosetting resin. Due to this, the spiral flow length in transfer molding can be greatly improved, i.e. from 40–60 cm of the conventional to 80–120 cm of the invention. Furthermore, the melt viscosity in transfer molding also can be greatly improved, i.e. from 40–60 Pa·s in the conventional to 4–10 Pa·s of the invention. As noted above, because of silica amount reduction, thermal conductivity somewhat lowers, i.e. from 1.5–2.5 W/m·° C. in the conventional to 1.0–2.0 W/m·° C. in the invention. However, by the large improvement in spiral flow and melt viscosity, the thickness of the resin seal body 41 at the below of the substrate can be improved from 0.8 mm in the conventional to 0.5 mm in the invention. In conclusion, resin resistance can be improved by approximately 0.2–0.5° C./W.

In addition, a great effect is obtained by the change of silica from a spall form into a spherical form. In the conventional thermosetting resin, the spiral flow length upon transfer mold is 40–60 cm and problematic in viscosity wherein, at the same time, melt silica is in a spall form. Consequently, the spall-formed silica, particularly at its end, of thermosetting resin contacts a metal fine wire 37 under an injection pressure during transfer molding, thereby falling down or breaking the metal fine wire 37.

However, the invention, changed melt-silica form into a spherical form, can reduce the melt-silica size itself and also remove the conventional spall-formed silica of an acute angle at an end of thereof. Specifically, the silica form in the conventional has a greatest diameter of approximately 40–60 μm although not to be definitely considered because of its spall form. However, the fused silica of the invention is spherical having a greatest diameter of approximately 30 μm. This can greatly reduce the affection of falling down, breakage and the like in the metal fine wire 37 during transfer molding. Furthermore, by the size reduction of molten silica itself, resin can easily flow even to a thin-walled region of the resin seal body 41 at the below of the substrate 31. Accordingly, as noted above, the invention can improve the thickness of the resin seal body 41 at the below of the substrate 31 from 0.8 mm in the conventional to 0.5 mm in the invention.

Furthermore, the thermosetting resin of the invention is used by adding an ion trap agent in the thermosetting resin. As described above, because the transfer mold process carries out a molding process at a lower temperature as compared to the injection mold process, there is a case that the ions in a thermosetting resin catalyst is completely removed away. However, by previously adding an ion trap agent in the thermosetting resin, ions can be positively removed thereby preventing leakage at high voltage.

Furthermore, the thermosetting resin of the invention has a glass transfer temperature of approximately 140–160° C. Due to this, in a standing operation for stabilizing the resin property of the resin seal body 41 after transfer molding, although the permissible storage temperature of the active element 35 and the like mounted on the substrate 31 is for example 160° C., operation can be carried out satisfying that condition. As a result, the thermosetting resin of the invention stabilizes in resin property, to realize a hybrid integrated circuit device satisfying the product quality of the active element 35 or the like mounted on the substrate 31.

FIG. 4B shows curability during transfer molding of the thermosetting resins of the invention and in the conventional. As shown in the third consideration point, it is targeted to shorten the operation time during forming by transfer molding, i.e. the resin pouring time and the post-forming standing time for stabilizing the resin property. As shown, the thermosetting resin of the invention, improved as above, can positively obtain hardness in a brief time and realize a resin seal body 41 stable in resin property.

Figure 13:
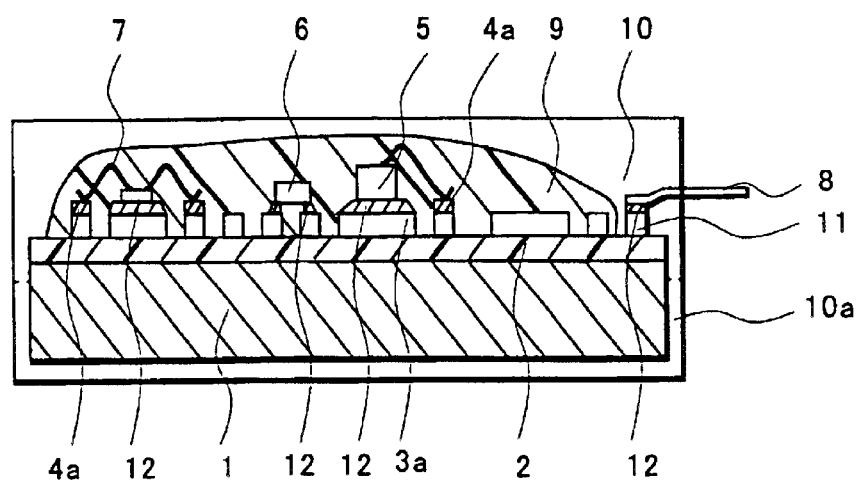
FIG. 13 is a sectional view explaining a sectional view of a conventional hybrid integrated circuit device.
Figure 14:
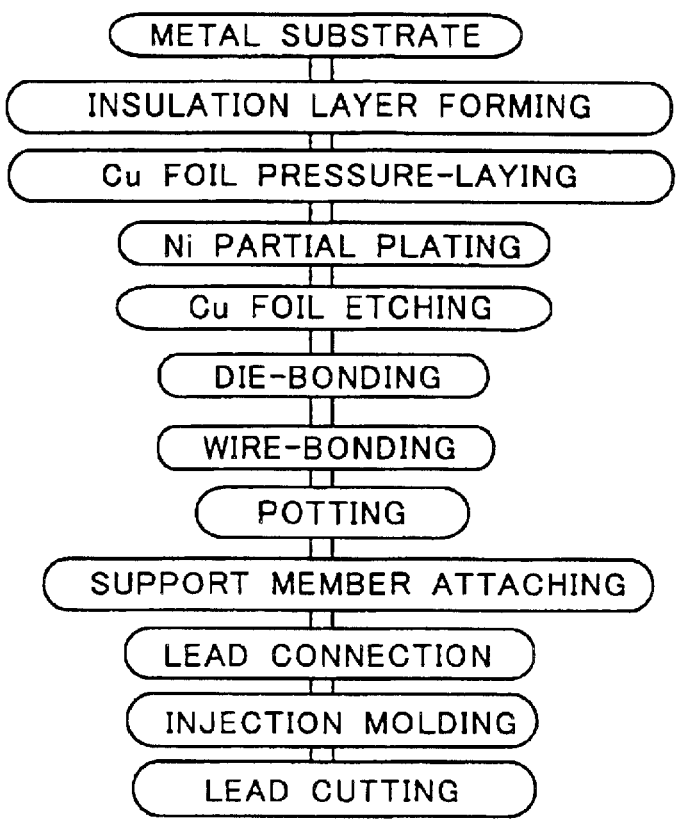
FIG. 14 is a flowchart of a conventional manufacturing method of a hybrid integrated circuit device.
Figure 15A:
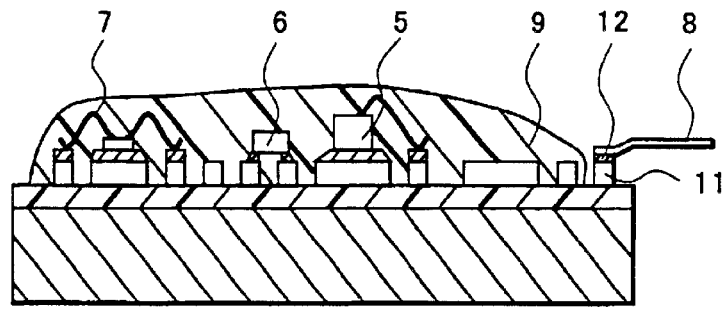
FIGS. 15A to 15C are sectional views explaining a conventional manufacturing method of a hybrid integrated circuit device.
Figure 15B:
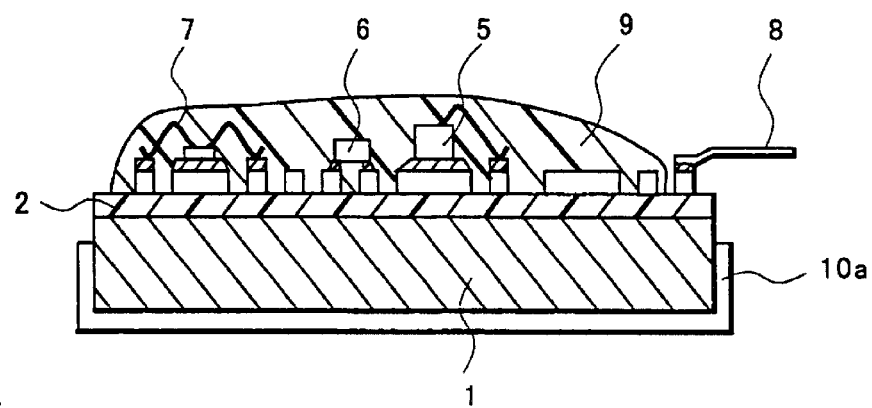
Figure 15C:
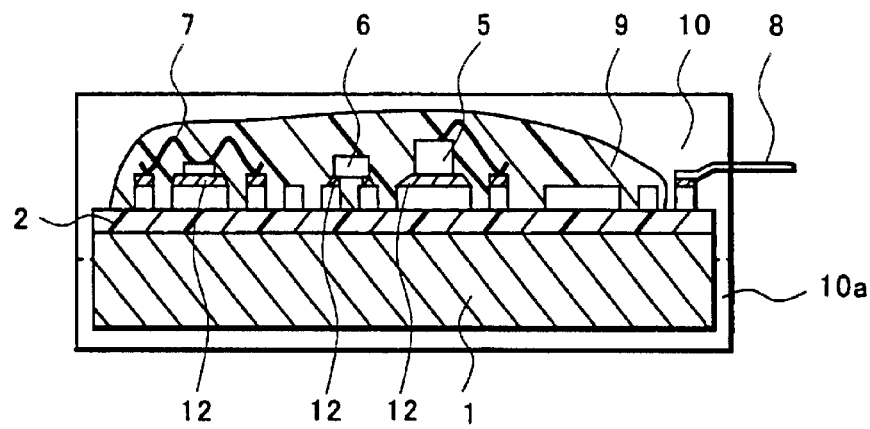
Figure 16A:
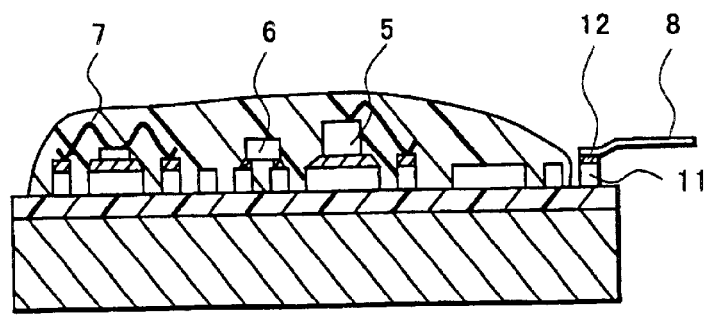
FIGS. 16A to 16C are sectional views explaining a conventional manufacturing method of a hybrid integrated circuit device.
Figure 16B:
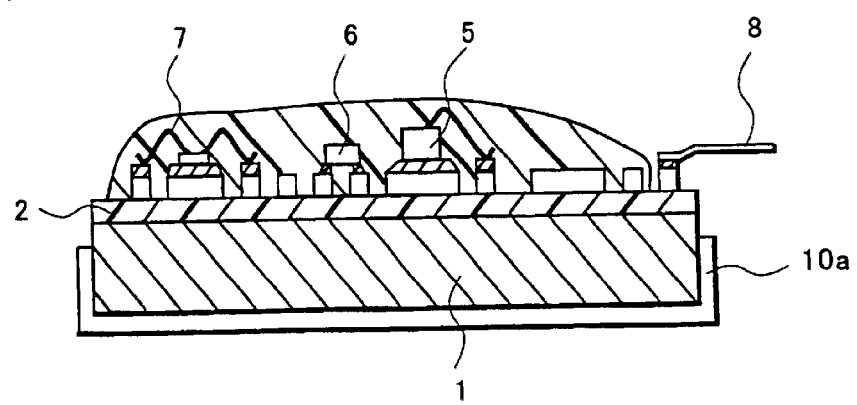
Figure 16C:
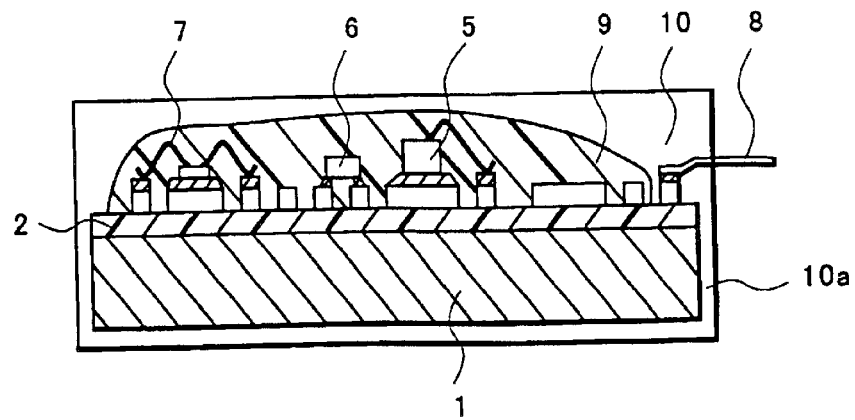

As noted above, according to the hybrid integrated circuit device of the invention, in the resin seal body 41, the thermosetting resin used in transfer molding has a low viscosity and a lower curing temperature than a melting point, e.g. 180° C., of the blaze material 40 (solder or the like) used in the foregoing connecting member. This makes it possible to eliminate the overcoat 9 due to potting of a thermosetting resin (e.g. epoxy resin) as required in the conventional hybrid integrated circuit device, as shown in FIG. 13.

As a result, in case an Al fine wire, having a diameter of approximately 40 μm for electrical connection of a small-signal IC or the like with a conductive path 33a, is directly poured with a thermosetting resin during transfer mold, there is no possibility of breakage or bending thereof.

Figure 5:
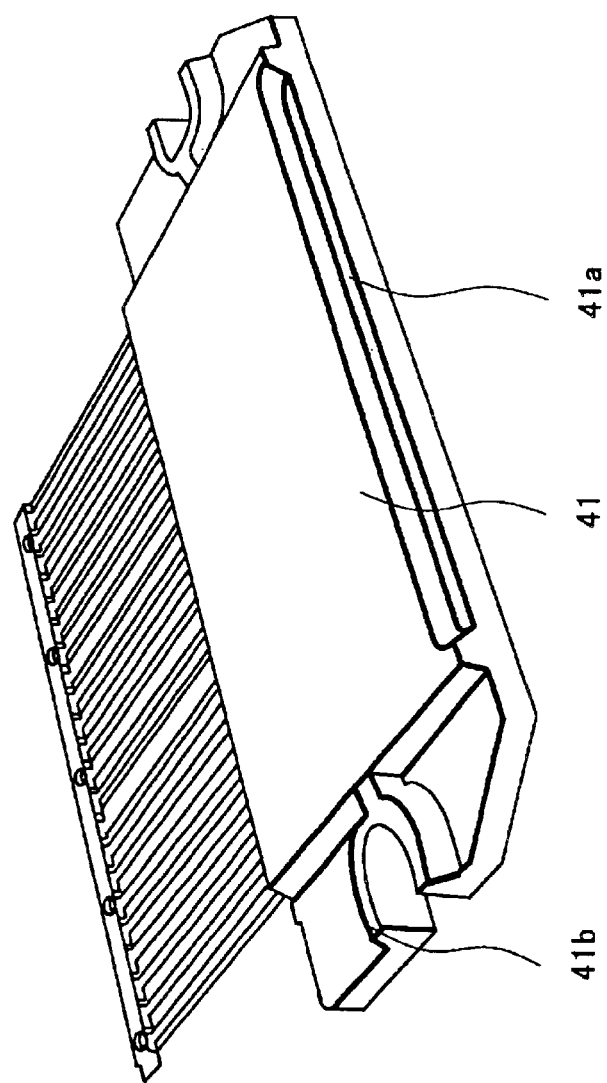
FIG. 5 is a perspective view explaining the hybrid integrated circuit device of the invention.

As shown in FIG. 5, in the hybrid integrated circuit device of the invention, the resin seal body 41 covering the substrate 31 is provided with a feature in order to prevent the substrate 31 from warping.

In the invention, a thin-walled region 41a having nearly the same length as the longer side of the substrate 31 is formed on a side of the resin seal body 41 opposite to the side outer leads extend. Meanwhile, a resin injection port is provided on the side close to the thin-walled region 41a. The resin seal body 41 is formed small in thickness at the upper, lower and side surfaces of the substrate 31 corresponding to the thin-walled region 41a, as shown in FIG. 1A. Also, the thin-walled region 41a is somewhat provided in an area over the substrate 31, and the resin seal body 41 is formed substantially thick in a device mounting region. There is a problem of a warp of the substrate 31, generally, due to contraction upon curing the thermosetting resin. In the invention, this is solved by providing a thin-walled region 41a also in the upper of the resin seal body 41.

Specifically, first, at the below of the substrate 31 and its periphery, pouring and curing is earlier in time in the thin formed region and integrated with the substrate thereby coping with the warpage in the substrate 31. Second, at the above of the substrate 31, a thin-walled region 41a is provided vertically relative to a direction of warping up of the substrate 31 so that the thin-walled region 41a is cured earlier thereby coping with that. Third, as shown in FIG. 5, the surface of the resin seal body 41 at above the substrate 31 has the surfaces defining various angles to the mount surface of the substrate 31. Consequently, by combining the surfaces, a side is formed to reduce the stress warping up the substrate 31, thereby being able to counter the stress warping up the substrate 31.

Namely, the above three structural features provide an effect to expand against the contraction of a thermosetting resin at the above of the substrate 31 when the thermosetting resin is cured. This structure eliminates warp-up out of the substrate 31 of the hybrid integrated circuit device of the invention, thus improving mountability.

Meanwhile, although the thin-walled region 41a is also utilized in a transfer mold process, referred later, the detail of which will be described therein.

Furthermore, in the invention, the resin seal body 41 has thick-walled regions 41b formed, e.g. in a U-form, in a manner longitudinally sandwiching the substrate 31. The U-formed thick-walled region 41b has an upper surface having the same height as the upper surface of the resin seal body 41. Namely, the both have the equal thickness. However, the U-formed thick-walled region, narrow in width, has a feature of short cure time similarly to the thin-walled region 41a. Consequently, similarly to the thin-walled region 41a, this can prevent against the warp up of the substrate 31 when the thick-walled region in the above of the substrate 31 is cured.

Meanwhile, the resin seal body 41, when taken out of the mold and again annealed after transfer molding, is clamped at main and back surfaces of the resin seal body 41 by metal plates and simultaneously pressurized in order to suppress warp up. At this time, the U-formed thick-walled region 41b is flush with the surface of the resin seal body 41. Because positive abutment can be made, a structure is realized that prevents against warp up of the substrate 31.

As described above, besides, the invention is characterized by being covered by the integral resin seal body 41 due to transfer molding. Due to this, although the resin seal body 10 of the conventional hybrid integrated circuit device forms an abutment region at between the support member 10a and the injected thermosetting resin, the present invention does not form such an abutment region thereby improving moisture resistance and eliminating the necessity of the support member 10a. Thus, it is possible to realize a hybrid integrated circuit device greatly reduced in material and operation cost.

Furthermore, according to the hybrid integrated circuit device of the invention, the resin for use in transfer molding has a low viscosity and a lower curing temperature than a melting point, e.g. 183° C., of the solder used in the foregoing connecting member. Due to this, the hybrid integrated circuit device of the invention can eliminate the overcoat 9 covering the active element 5, passive element 6, metal fine wire 7, solder joints 12 and the like in the conventional hybrid integrated circuit device, whereby a resin seal body 41 can be formed directly on the substrate 31. As a result, it is possible to realize a hybrid integrated circuit device greatly reduced in material and operation cost.

Furthermore, the hybrid integrated circuit device of the invention has an insulating resin 32 having approximately 40 μm formed on a conductor metal substrate 31 and a conductive path 33a formed by Cu foil on the insulating resin 32. Also, by virtue of grounded substrate 31, the hybrid integrated circuit device of the invention can form a magnetic shield structure. Due to this, although the hybrid integrated circuit device of the invention is to be set up and used on a chassis or the like, the radio wave generated outside the hybrid integrated circuit device is blocked by the substrate before intruding to the circuit on the substrate 31. As a result, there is no possibility of intrusion of the extrinsic noise caused outside the hybrid integrated circuit device. Thus, it is possible to realize a hybrid integrated circuit device greatly reduced in the erroneous operation on the circuit.

Next, explanation will be made on a method of manufacturing a hybrid integrated circuit device of the invention, with reference to FIGS. 6 to 12.

Figure 6:
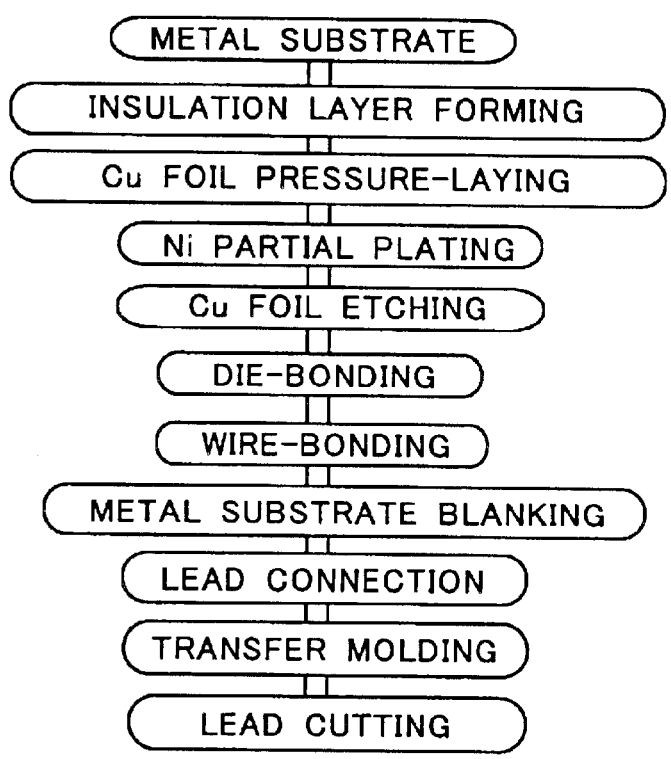
FIG. 6 is a flowchart of a manufacturing method of a hybrid integrated circuit device of the invention.

FIG. 6 is a process flowchart, including a metal substrate preparing process, an insulating layer forming process, a Cu foil pressure-laying process, an Ni partial plating process, a Cu foil etching process, a die bonding process, a wire bonding process, a metal substrate blanking process, a lead connection process, a transfer mold process, and a lead cutting process. As apparent from the flow, it is a conventional practice to form a resin seal body by injection molding. The invention, however, has realized a process to form a resin seal body by transfer molding.

FIGS. 7A to 12B show the sectional views of the processes. Note that the processes, that are apparent Without showing, are omitted in the figures.

Figure 7A:
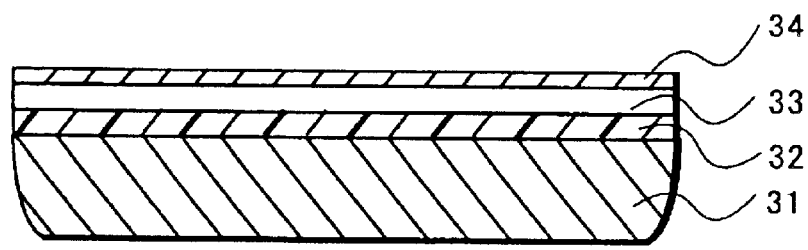
FIGS. 7A to 7C are sectional views explaining the manufacturing method of a hybrid integrated circuit device of the invention.

FIG. 7A shows process of preparing a metal substrate, forming an insulating layer, and pressure-laying a Cu foil.

In the metal substrate preparing process, a substrate is prepared taking into consideration the properties of heat dissipation, substrate strength, substrate shield and so on. In this case, emphasis is placed particularly on heat dissipation property because heat concentration is caused by density increase where densely mounting integrating power transistors, large-scaled LSIs, digital signal processing circuits, etc. on one small-sized hybrid IC. The present embodiment explains the case using an substrate 31 having a thickness of, e.g. approximately 1.5 mm, that is excellent in heat dissipation property in consideration of the above point. Also, although this embodiment explains the case using an Al substrate as the substrate 31, there is no especial limitation.

For example, the present example can be realized by using, as the substrate 31, a print substrate, a ceramic substrate, a metal substrate or the like. It is possible to consider, as a metal substrate, a Cu substrate, an Fe substrate, an alloy such as an Fe—Ni substrate or a AlN substrate.

Next, the aluminum substrate 31 is anodized to cause an oxide in its surface. Furthermore, a resin 32 excellent in insulation property, e.g. epoxy resin, is formed on the entire surface thereof. Note that the metal oxide may be omitted without problem where voltage resistance is not taken into consideration. Then, a Cu conductor foil 33 is pressure-laid on the insulating resin 32, to constitute a hybrid integrated circuit. On the Cu foil 33, Ni plating is provided over the entire surface in consideration of an adhesion to a metal fine wire 37 for electrical connection between the Cu foil 33 for turning into an lead-out electrode and the active element 35.

Figure 7B:
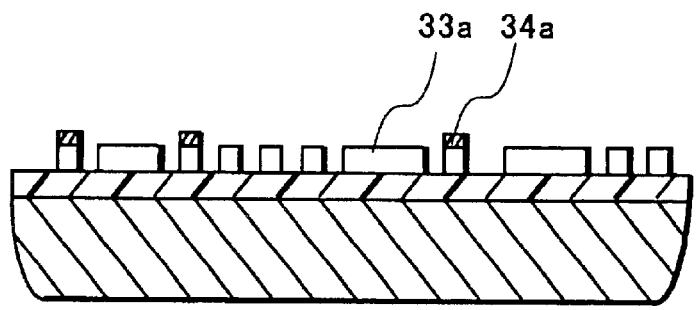

Next, FIG. 7B shows process of Ni plating and etching the Cu foil.

On the Ni plating 34, resist is left only in an area requiring Ni plating 34 by known screen-printing or the like to form an anti-etching mask. Then, Ni plating 34a is selectively formed by etching, e.g. in an area for turning into an lead-out electrode, on the Cu foil 33. Thereafter, the resist is removed away. Again, resist is left only in an area requiring a Cu-foil conductive path 33a by known screen-printing or the like to form an anti-etching mask. Then, a conductive path 33a is formed from Cu foil 33 on the insulating resin 32 by etching. Thereafter, a resin coating is formed of an epoxy resin on the conductor pattern 33a by screen-printing, for example. This resin coating works as a protect film and is removed at a region for electrical connection.

Figure 7C:
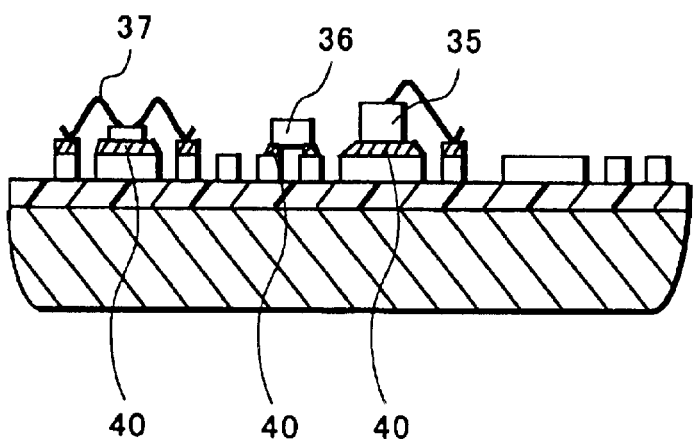

FIG. 7C shows the processes of die bonding and wire bonding, as shown in FIG. 4C.

On the conductive path 33a formed in the preceding process, an active element 35 such as a power transistor, a small-signal transistor or IC, and a passive element such as a chip resistor or a chip capacitor, are mounted through a conductive paste, such as a solder paste 40, thereby realizing a predetermined circuit. Herein, by providing electrical connection with an Ag paste or the like, solder may not be partly employed. Meanwhile, when mounting an active element 35, such as a power transistor or a semi-power transistor, a heat-sink is provided between the active element 35 and the conductive path 33a, in consideration of heat dissipation.

Next, in the case of mounting face up an active element 35, such as a semiconductor chip, electrical connection is made through a metal fine wire 37 by bonding. As noted above, the metal fine wire 37 for electrical connection between the active element 35 and the conductive path 33a is wire-bonded through the Ni plating 34 on the conductive path 33a, in consideration of an adhesion to the Cu-foiled conductive path 33a.

Herein, the metal fine wire 37 employs especially an Al fine wire 37. Because an Al wire 37 is difficult in forming a true-sphere ball, a stitch bonding scheme is employed. However, the stitch bonding scheme is featured that a stitch point is readily broken by a resin stress and low in elastic modulus as compared to an Au wire thus readily fallen down under resin pressure. Accordingly, where using an Al fine wire 37, caution must be paid especially during forming a resin seal body 41. As for the present invention, caution is paid where using the Al fine wire, detailed is referred later.

Figure 8:
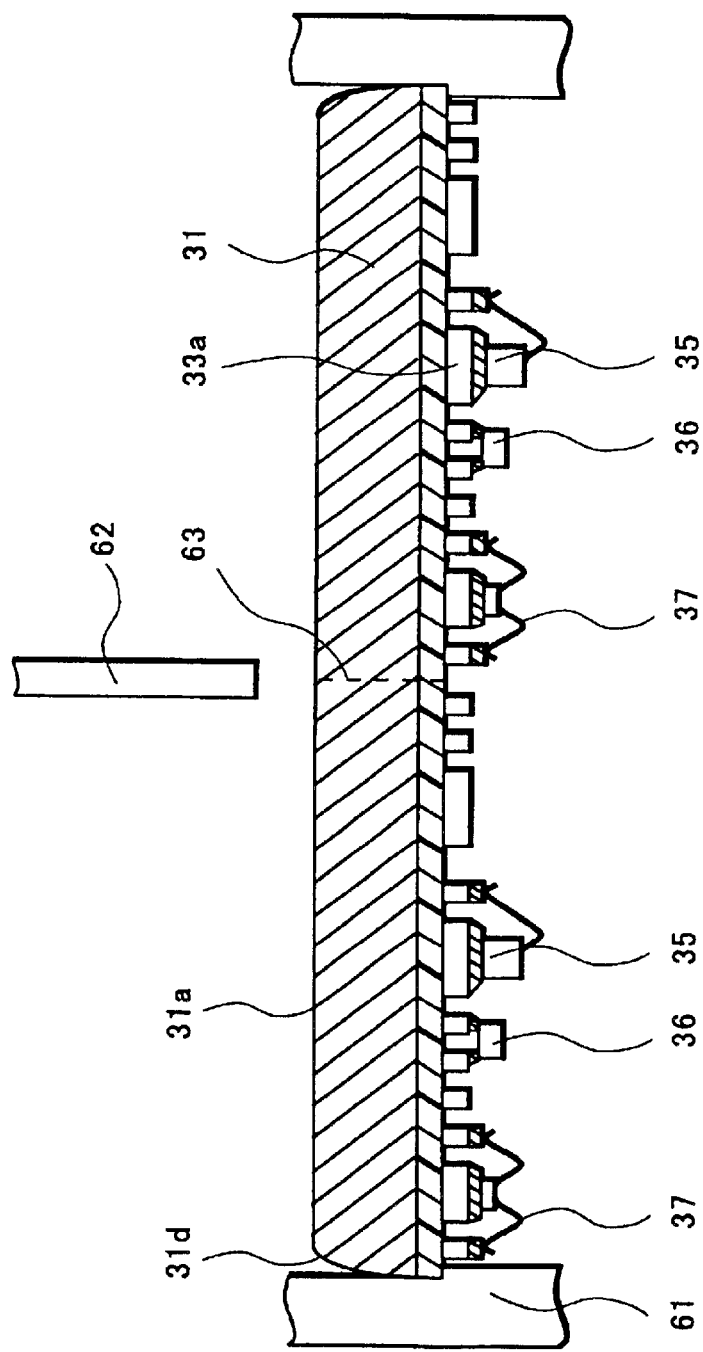
FIG. 8 is a sectional view explaining the manufacturing method of a hybrid integrated circuit device of the invention.

FIG. 8 shows a metal substrate blanking process.

As explained to the preceding process, a conductive path 33a is formed on a substrate 31 to provide thereon an active element 35, a passive element 36 and the like. Meanwhile, although the figure illustrates to form hybrid integrated circuit on one substrate 31, the same pattern of hybrid integrated circuits, e.g. two or four, is practically formed on one substrate 31. The first prepared substrate 31 (see FIG. 7A) is the one in a strip form blanked from one metal plate, taking account the size of the substrate 31. Accordingly, the substrate 31 is already formed with a curved surface 31d in a peripheral blanked surface thereof.

As shown in the figure, because the substrate 31 forms individual hybrid integrated circuit substrates, the substrate 31 is placed on a pedestal 61. At this time, as shown in FIG. 2A, the substrate 31 is formed with a peripheral region 43 as a space where nothing is formed other than an insulating resin 32. There is no possibility to break the already-formed hybrid integrated circuits because of placement at the peripheral region 43 on the pedestal 61. Thereafter, the common substrate 31 is blanked by a punch 62 at a blanking surface 31a to complete individual substrates 31.

In this blanking process, a curved surface 31d is formed in the blanking surface 31a of the substrate 31 while burr 31c is formed in a surface 31b opposite to the blanking surface 31a.

Figure 9A:
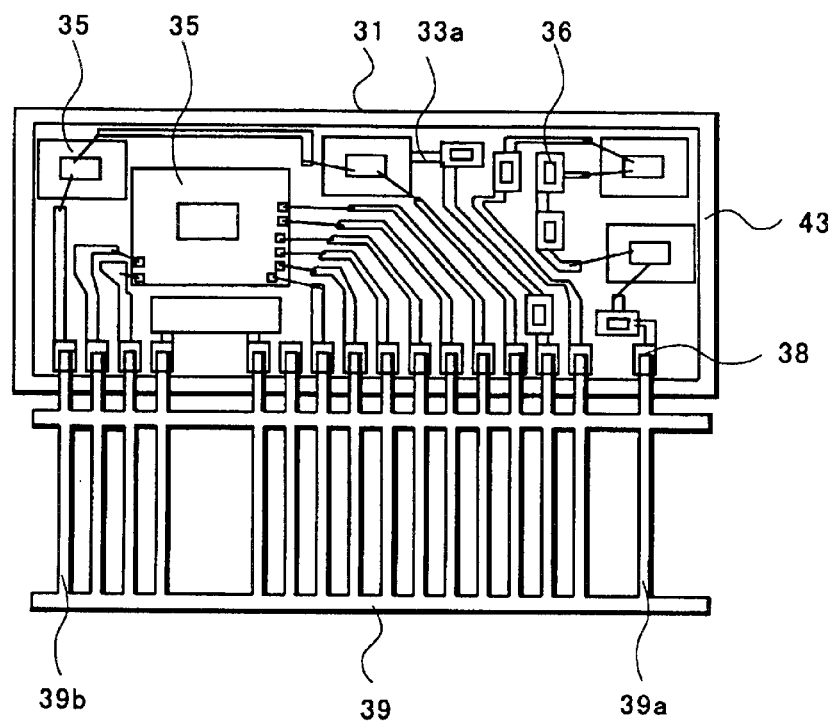
FIG. 9A is a plan view explaining the manufacturing method of a hybrid integrated circuit device of the invention.
Figure 9B:
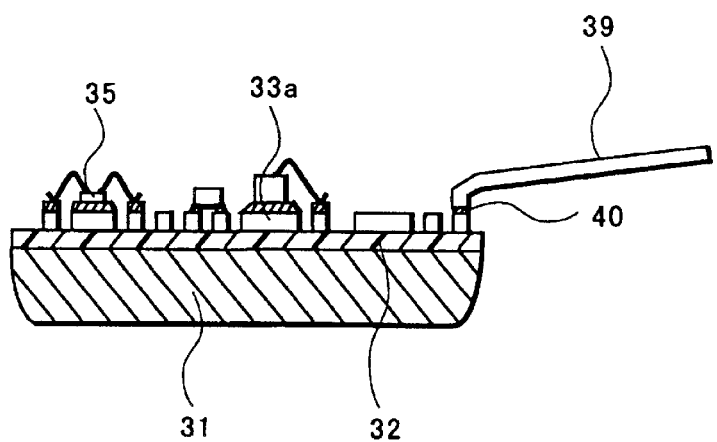
FIG. 9B is a sectional view thereof.

FIGS. 9A and 9B show a lead connection process.

As shown in FIG. 9A, prepared is an outer lead 39 for outputting and inputting signals from and to the hybrid integrated circuit. The outer lead 39 is formed of a conductive material of Cu, Fe—Ni or the like in order for use as an output and input terminals. Furthermore, the width and thickness of the outer lead 39 is determined by taking a current capacity and the like into consideration. Although the detail will be explained in the next transfer mold process, the embodiment of the invention prepares an outer lead 39 having a thickness, for example, of approximately 0.4–0.5 mm because the outer lead 39 requires strength and springiness. Thereafter, the outer lead 39 is connected to an external connection terminal formed in a peripheral region of the substrate 31 through a solder 40. At this time, connecting member is not necessarily limited to solder but connection can be by spot welding or the like.

Herein, as shown in FIG. 9B, according to the invention, the outer lead 39 is connected at a somewhat angle, e.g. approximately 10°, to a mount surface of the substrate 31, and a thermosetting resin to be used in the next transfer mold process has a cure temperature lower than a melting point of a solder 40 for connection between the outer lead 39 and the external connection electrode 38.

FIGS. 10 and 11 shows a transfer mold process.

Figure 10A:
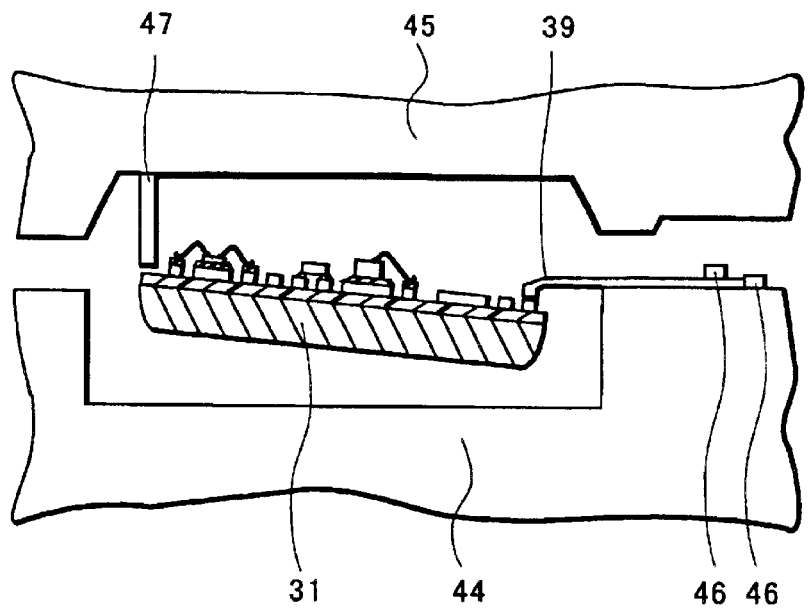
FIGS. 10A and 10B are sectional views explaining the manufacturing method of a hybrid integrated circuit device of the invention.

First explained is a lower mold die 44 shown in FIG. 10A. The lower mold die 44 is formed with guide pins 46 to positionally fix the outer lead 39. As a result, the substrate 31 is fixed in position.

Figure 10B:
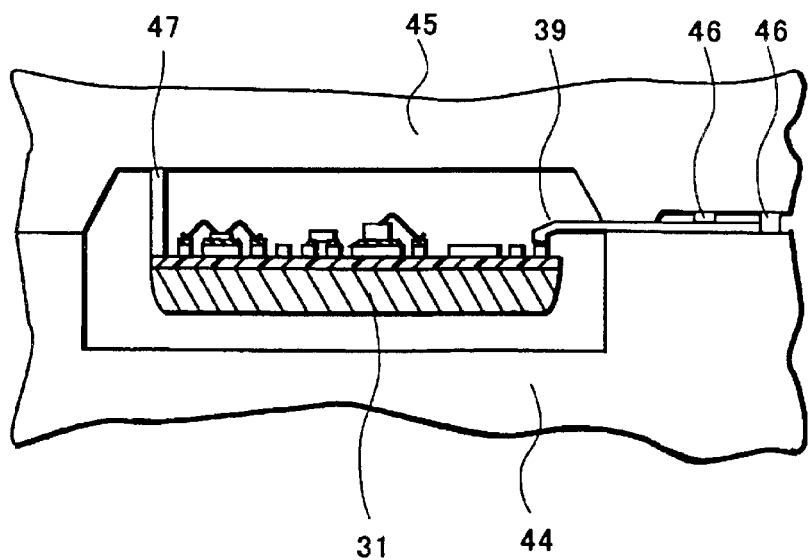

As shown in FIG. 10B, the substrate 31 connected with the outer lead 39 formed in the preceding process is placed on the lower mold die 44. By abutting the upper mold die 45 against the lower mold die 44, the outer lead 39 only is clamped to fix the substrate 31. At this time, because the outer lead 39 is connected, at a somewhat angle relative to horizontal, to the substrate 31, the substrate 31 at its tip rises toward the upper mold die 45. However, the tip of the substrate 31 is fixed by a pushpin 47 provided in the upper mold die 45, the substrate 31 can be kept in a horizontal position, with a spacing at a backside, relative to the lower mold die 44. At this time, as shown in FIG. 2, the pushpin 47 fixes a peripheral region 43 of the substrate 31. As noted before, because the peripheral region 43 has an insulating resin 32 or, as the case may be, overcoat resist covered on the substrate 31, the substrate 31 surface is prevented from being directly exposed from the resin seal body 41.

Figure 11A:
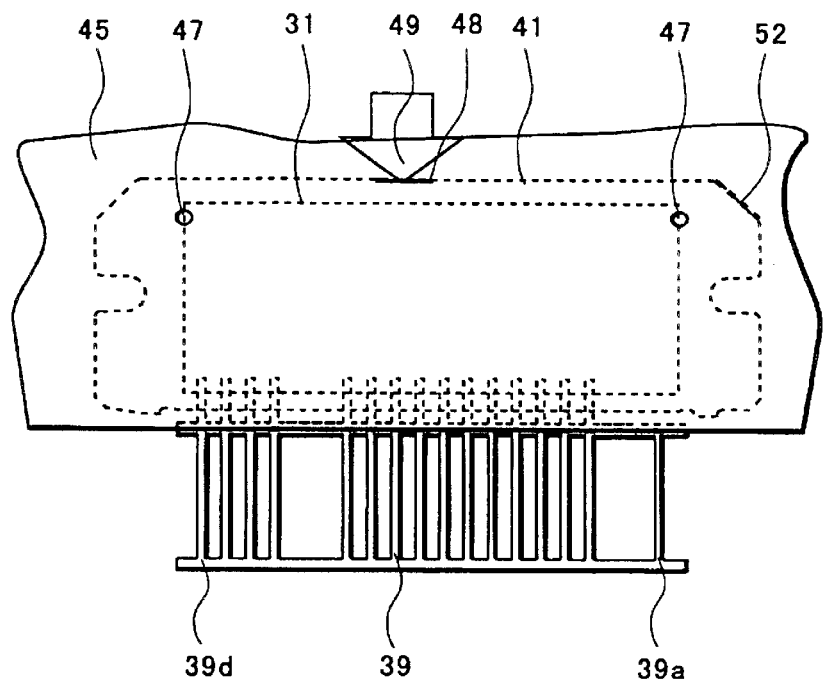
FIG. 11A is a plan view explaining the manufacturing method of a hybrid integrated circuit device of the invention.

Then, resin is injected through a gate 48 formed in the mold dies 44, 45 as shown in FIG. 11A, to form a resin seal body 41 over the substrate 31 by transfer molding. According to the invention, injection pressure is suppressed from 700–800 kg/cm$^2$ in the conventional to 80–100 kg/cm$^2$ in the invention as compared to the conventional injection mold process case, wherein, for example, resin injection temperature and mold temperature is kept at 160–180° C., whereby thermosetting resin is directly molded over the active element 35, passive element 36 and Al fine wires 37 without providing a conventional overcoat 9 (see FIG. 13). In this case, the gate 48 is formed in a position at a longer-side end face of the substrate 31, herein a center in a side surface opposite to the side surface having the outer lead 39. This allows an injection thermosetting resin to spread in every direction upon entering a cavity 54 (see FIG. 11B) through the gate 48. As a result, the injection velocity of thermosetting resin is reduced thereby preventing the effect of falling down or breaking the Al fine wires 37.

For example, in the case of forming a gate 48 in a position 52 corresponding to an end of the substrate 31, the thermosetting resin injecting through the gate 48 into the cavity 54 spreads to the above and below of the substrate 31. However, differently from the foregoing case, the spreading region is narrow. As a result, because the thermosetting resin is not fully reduced in injection velocity, the phenomenon readily occurs of falling down or breaking the Al fine wires 37 rather than the case with the gate position 48.

Figure 11B:
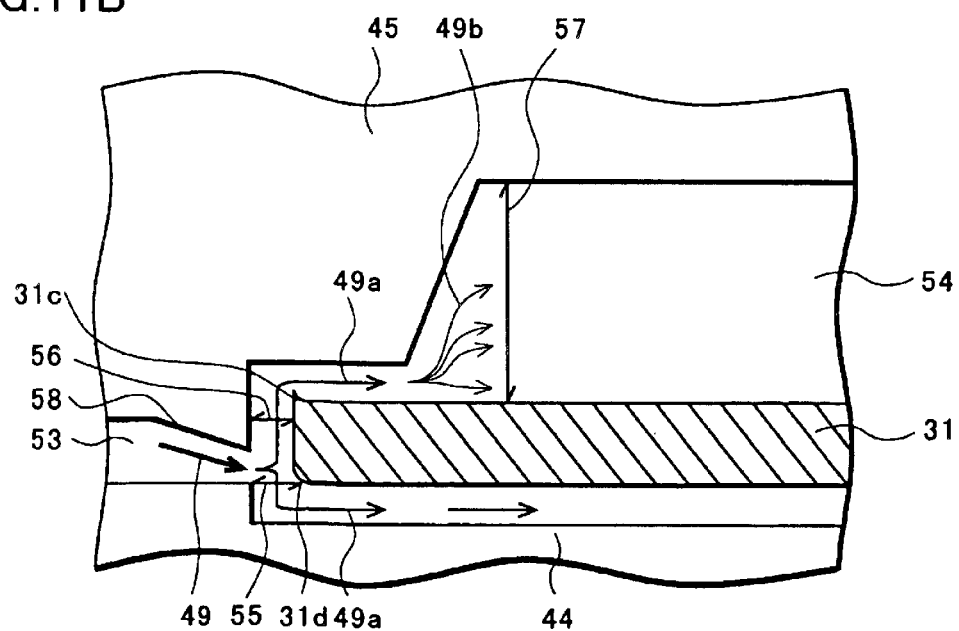
FIG. 11B is a sectional view thereof.

As shown in FIG. 11B, in the manufacturing method of a hybrid integrated circuit device of the invention, the thermosetting resin to be injected through the gate into the cavity 54 is injected in a manner first hitting a side surface of the substrate 31, as shown at an arrow 49. The resin is injected through the above and below of the substrate 31, as shown at an arrow 49a. The resin seal body 41 at the below of the substrate 31 is formed to a thickness of 0.5 mm, for example. At this time, as noted before, the substrate 31 at the outer lead 39 is fixed by the mold dies 44, 45, and further fixed by a pushpin 47 formed in the upper mold die 45. Consequently, in order to form the resin seal body 41 at the below of the substrate 31 to a thickness, e.g. of 0.5 mm, there is resistance to the stress of at the below of the substrate 31. However, it is impossible to cope with the stress at the above of the substrate 31. Accordingly, thermosetting resin must be poured at the below of the substrate.

Accordingly, according to the manufacturing method of a hybrid integrated circuit device of the invention, transfer molding is carried out by positioning a burr 31c as explained in the metal-plate blanking process on an upper mold die 45 side and a curved surface on a lower mold die 44 side. In this case, because thermosetting resin is injected by the utilization of the curved surface 31d formed on the substrate 31, it is further poured to the below of the substrate 31.

Due to this, because a resin seal body 41 is first formed at the below of the substrate, it is formed to an even thickness though the thickness is as thin as 0.5 mm. Also, the burr 31c is formed approximately 100 μm in a surface of the substrate 31 having a thickness, for example, of 1.5 mm. The burr 31c has a structure having a weak strength. Consequently, although the burr 31c is readily broken under a resin pressure in transfer molding, there is no possibility that fragmented burrs 31c be contained in the resin seal body 41 at the lower of the substrate 31. As a result, it is possible to realize a method of manufacturing a hybrid integrated circuit device having high voltage resistance, excellent heat dissipation property and high product quality.

Meanwhile, as shown in FIG. 11B, in the manufacturing method of a hybrid integrated circuit device of the invention, the thermosetting resin to be injected through the gate 48 into the cavity 54 is injected in a manner first hitting a side surface of the substrate 31. The thermosetting resin injected as shown at the arrow 49 flows branching to the above and below of the substrate 31. At this time, because the width of flow 56 to the above of the substrate 31 and the width of flow 55 to the below of the substrate 31 are provided nearly equal, the thermosetting resin is allowed to flow toward the below of the substrate 31. Furthermore, the velocity and pressure of thermosetting resin is reduced by once hitting at the side surface of the substrate 31, to prevent the effect of bending or breakage in the Al fine wires 37.

In order to further reduce the injection velocity and pressure of the thermosetting resin flowing above the substrate 31 as shown at the arrow 49a, the cavity 54 is enlarged at the above of the substrate 31 within the upper mold die 45. As a result, the flow width 57 of thermosetting resin at the above of the substrate 31 is broadened than the flow width 56 close to the gate 48, to allow thermosetting resin to spread furthermore as at an arrow 49b. Thus, the injection velocity and pressure of thermosetting resin can be decreased at the above of the substrate 31.

Furthermore, as shown in FIG. 11B, in the manufacturing method of a hybrid integrated circuit device of the invention, a slant 58 is formed in a runner upper part in an injection region of from the gate 48 into the cavity 54. Of the runner 53 width and the gate 48 width, the gate 48 is narrower in width. Due to this, because the thermosetting resin is injected with inclination relative to the mount surface of the substrate 31, the thermosetting resin is moderated in flow toward the above of the substrate 31 and also allowed to flow to the below. As a result, the thin-walled region at the lower of the substrate 31 and its vicinity can be formed in early time, thereby suppressing the effect upon the Al fine wires 37. Due to this, the thin-walled region is cured earlier during hardening. This acts as a support member to prevent the warp of the substrate 31.

Furthermore, according to the manufacturing method of a hybrid integrated circuit device of the invention, as compared to the case of the conventional injection mold, the injection pressure is suppressed and a thermosetting resin is used as a resin so that thermosetting resin can be injected while being melted by keeping a resin injection and mold temperature at 160–180° C. This reduces the injection pressure and makes the fused silica in thermosetting resin into a spherical form. It is accordingly possible to carry out molding of thermosetting resin directly onto the Al fine wires 37 without using resin potting for suppressing breakage or the like of the Al wires 37 including thin and thick wires.

Furthermore, because the curing temperature of thermosetting resin is lower than a melting point of the solder 40 connecting the active element 35 such as a power transistor, small-signal transistor or IC, a passive element 36 such as a chip resistance or chip capacitor, and outer lead 39, there is no possibility of deviation in mount position due to re-melting by the heat of upon transfer molding without the protection with an overcoat 9 (see FIG. 13) due to the conventional hybrid integrated circuit device.

Figure 12:
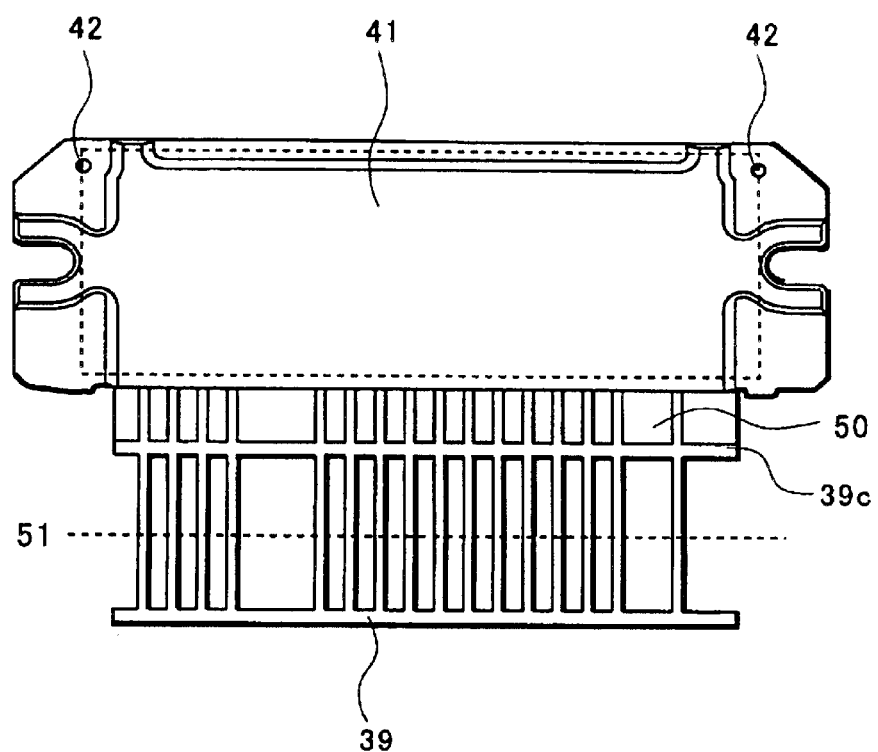
FIG. 12 is a plan view explaining the manufacturing method of a hybrid integrated circuit device of the invention.

FIG. 12 shows a lead cutting process.

As shown in FIG. 12, the resin, flowed through a thickness of an outer lead from the mold 44 during the preceding transfer mold process, is dammed by the tie-bar 39c formed on the outer lead 39, thus being cured as it is. Namely, leaked resin is filled at between the leads of the outer lead 39 in an area closer to the resin seal body 41 than the tie-bar 39c thereof. However, there is structurally no resin leakage to between the leads closer to the tip of the outer lead 39 than the tie-bar.

The leaked resin 50 is removed simultaneous with punching away the tie-bar 39c. Also, in accordance with a use purpose, the outer lead 39 is cut, for example, at a position of a dotted line 51 to adjust the length of the outer lead 39, thereby being made into individual leads for serving as input/output terminals.

By the above process, completed is a hybrid integrated circuit device shown in FIG. 1.

As described above, the manufacturing method of a hybrid integrated circuit device of the invention carries out the transfer mold process by positioning the burr 31c explained in the metal substrate blanking process on the side of the upper mold die 45 and the curved surface 31d on the side of the lower die 44. Due to this, the resin seal body 41 at the below of the substrate 31 can be made evenly to a required minimum thickness. Also, there is no possibility for broken fragments of the conductive material substrate 31 to exist in the resin seal body 41 at the below of the substrate 31. As a result, a manufacturing method of a hybrid integrated circuit device having high voltage resistance, excellent heat dissipation property and high product quality is realized.

Furthermore, the manufacturing method of a hybrid integrated circuit device of the invention carries out blanking of a common substrate 31 formed with a plurality of hybrid integrated circuits including conductive paths 33a, active elements 35, passive elements 36 and the like, at the blanking surface 31a of the substrate 31, to form individual substrates 31. Due to this, because the foregoing curved surface 31d can be formed on the substrate 31, it is possible to favorably flow a therm-set resin during transfer molding.

The manufacturing method of a hybrid integrated circuit device of the invention was explained on the full-mold type hybrid integrated circuit device but is not limited to the above embodiment. For example, it is possible to form a hybrid integrated circuit device exposed in the entire back surface of the hybrid integrated circuit substrate. In this case, besides the foregoing effects, an effect of improved heat dissipation can be obtained furthermore.

Furthermore, although the present embodiment explained on the case with one-sided leads having outer leads extending at one side surface of a substrate, the invention is not limited to this structure. With both-sided or four-way leads, besides the above effect, a transfer mold process can be realized in a state of stabilizing a substrate. Besides, various modifications are possible within a range not departing from the gist of the invention.

According to the hybrid integrated circuit device of the invention, the hybrid integrated circuit substrate has, in its surface, a burr formed in the blanking process and, in its back surface, a curved surface formed in the blanking process. The bur is structurally weak in strength and ready to be broken under a resin injection pressure during transfer molding. However, the broken burr is structurally not existed in a resin seal body at the below of the substrate. Due to this, the hybrid integrated circuit device of the invention has a required minimum resin thickness to provide high voltage registance at the below of the substrate. Also, a hybrid integrated circuit device can be realized that is excellent in product quality.

Furthermore, according to the hybrid integrated circuit device of the invention, the thermosetting resin to be used in transfer molding has a low viscosity and a cure temperature lower than a melting point, e.g. 183° C., of the solder used in the connecting member. Consequently, the hybrid integrated circuit device can eliminate the overcoat resin covering the active element, passive element, metal fine wires, solder joints and so on of the conventional hybrid integrated circuit device. As a result, a hybrid integrated circuit device can be realized which has thermosetting resin directly covering the hybrid integrated circuit substrate and is greatly reduced the material and operation cost due to the conventional potting.

Furthermore, according to the hybrid integrated circuit device of the invention, the thermosetting resin for forming a resin seal body uses a low viscous, fluid resin. In order to make the thermosetting resin low in viscous, the amount of silica is reduced by 20–40% as compared to the conventional thermosetting resin. This can greatly improve the spiral flow length upon transfer molding from 40–60 cm in the conventional to 80–120 cm in the invention. The melt viscosity upon transfer molding can be also greatly reduced from 40–60 Pa·S in the conventional to 4–10 Pa·S in the invention.

Furthermore, according to the hybrid integrated circuit device of the invention, fused silica is changed from the conventional spall form into spherical form. Due to this, by the size reduction of melt silica itself, the resin seal body at the below of the substrate can be formed small in thickness. As a result, realized is a hybrid integrated circuit device having high voltage resistance, excellent heat dissipation property and high product quality.

Furthermore, according to the hybrid integrated circuit device of the invention, the use of the thermosetting resin improves the thickness of the resin seal body at the below of the substrate from 0.8 mm in the conventional to 0.5 mm in the invention. Although this somewhat lowers heat conductivity due to the reduction in silica amount, the thickness of the resin seal body at the below of the substrate can be decreased. In conclusion, resin heat resistance can be improved by approximately 0.2–0.5° C./W.

Furthermore, in the hybrid integrated circuit device of the invention, an ion trap agent is added to and used in the thermosetting resin. Due to this, because the transfer mold process carries out a mold process at a low temperature as compared to the conventional injection mold process, in the case of the ions in a thermosetting resin catalyst are not completely removed away, the ion trap agent added in the thermosetting resin can positively remove the ions, thereby preventing against the leakage at high voltage.

According to the manufacturing method of a hybrid integrated circuit device of the invention, the process for integrally molding a hybrid integrated circuit substrate by transfer molding is carried out by positioning a burr formed on the substrate on an upper mold die side and a curved surface on a lower mold die side. This can form a resin seal body at the below of the substrate to a required minimum thickness with evenness. Also, the broken fragments of the burr of conductive material are not existed in the resin seal body at the below of the substrate. As a result, realized is a method of a hybrid integrated circuit device having high voltage resistance, excellent heat dissipation property and high product quality.

Furthermore, in the manufacturing method of a hybrid integrated circuit device of the invention, a substrate formed with a plurality of hybrid integrated circuits having conductive paths, active elements, passive elements and the like is blanked at its back surface to form the substrates. Because this can form a curve surface in a back surface of the substrate, thermosetting resin is allowed to favorably flow upon transfer molding.

Furthermore, in the manufacturing method of a hybrid integrated circuit device of the invention, a substrate blanking process is carried out by abutting against a pedestal an outer periphery of the substrate not formed with the hybrid integrated circuit. This can form a curved surface in a back surface of the substrate without breaking the hybrid integrated circuit formed on the substrate.

What is claimed is:

1. A hybrid integrated circuit device comprising:
    a hybrid integrated circuit substrate having a main surface and a bottom surface opposite to the main surface;
    a conductive pattern provided at least on the main surface of the hybrid integrated circuit substrate;
    at least one of a semiconductor chip and a passive element mounted on the conductive pattern, wherein at least one of the semiconductor chip and the passive element is electrically connected to the conductive pattern;
    a lead connected to the conductive pattern and extended as an output or input to an outside; and
    a thermosetting resin integrally covering the substrate by transfer molding;
    wherein a blanking region punched from the bottom surface is arranged on the bottom surface.

2. The hybrid integrated circuit device according to claim 1, wherein a burr formed by punching is provided on the main surface of the substrate forming the conductive pattern.

3. The hybrid integrated circuit device according to claim 1, wherein a curved surface formed by punching is provided at least in the vicinity of the blanking region of the substrate.

4. The hybrid integrated circuit device according to claim 1, wherein the substrate is formed by a metal substrate.

5. The hybrid integrated circuit according to claim 1 wherein the semiconductor chip and the conductive pattern are electrically connected by a fine wire.

6. The hybrid integrated circuit device according to claim 5, wherein the fine wire comprises aluminum.

7. The hybrid integrated circuit device according to claim 5, wherein the thermosetting resin directly covers at least one of the semiconductor chip, the passive element and the aluminum fine wire.

8. A hybrid integrated circuit device comprising:
    a hybrid integrated circuit substrate having a main surface and a bottom surface opposite to the main surface;
    a conductive pattern provided at least on the main surface of the hybrid integrated circuit substrate;
    at least one of a semiconductor chip and a passive element fixed on the conductive pattern, wherein at least one of the semiconductor chip and the passive element is electrically connected to the conductive pattern;

a lead connected to the conductive pattern and extended as an output or input to an outside; and a resin seal body formed of a thermosetting resin covering at least one of the main surface and the bottom surface by transfer molding wherein a blanking region punched from the bottom surface is arranged on the bottom surface.

9. The hybrid integrated circuit device according to claim 8, wherein the aluminum fine wire has a diameter of 30 micrometers to 80 micrometers.

10. The hybrid integrated circuit device according to claim 8, wherein the substrate and the lead have connecting member of solder, the thermosetting resin having a cure temperature lower than a melting point of the solder.

11. The hybrid integrated circuit device according to claim 8, wherein the resin seal body is formed small in thickness, in the main surface and bottom surface, in a vicinity of an injection port of the thermosetting resin.

12. The hybrid integrated circuit device according to claim 8, wherein the resin seal body covers the entire of the substrate.

13. The hybrid integrated circuit device according to claim 8, wherein the resin seal body comprises a thin-walled region to prevent the substrate from warping.

14. The hybrid integrated circuit according to claim 8 wherein the semiconductor chip and the conductive pattern are electrically connected by a fine wire.

15. The hybrid integrated circuit device according to claim 14, wherein the thermosetting resin directly covers at least one of the semiconductor chip, the passive element and the fine wire.

16. A hybrid integrated circuit device comprising:

a hybrid integrated circuit substrate having a main surface and a bottom surface opposite to the main surface;

a conductive pattern provided at least on the main surface of the hybrid integrated circuit substrate;

at least one of a semiconductor chip and a passive element mounted on the conductive pattern;

a fine wire electrically connecting between the conductive pattern and at least one of the semiconductor chip;

a lead connected to the conductive pattern and extended as an output or input to an outside; and a thermosetting resin covering at least a surface of the substrate by transfer molding;

wherein the thermosetting resin contains a filler having a spherical form, and wherein a blanking region punched from the bottom surface is arranged on the bottom surface.

17. The hybrid integrated circuit device according to claim 16, wherein the substrate and the lead has connecting member of solder, the thermosetting resin having a cure temperature lower than a melting temperature of the solder.

18. The hybrid integrated circuit device according to claim 16, wherein the thermosetting resin includes an ion-trapping agent.

19. The hybrid integrated circuit according to claim 16 wherein the semiconductor chip and the conductive pattern are electrically connected by a fine wire.

20. The hybrid integrated circuit device according to claim 16, wherein a resin seal body formed of the thermosetting covers the entire of the substrate.

21. The hybrid integrated circuit device according to claim 20, wherein the resin seal body comprises a thin-walled region to prevent the substrate from warping.

22. The hybrid integrated circuit device according to claim 20, wherein a burr does not exist inside a bottom part of the resin seal body which is located below the hybrid integrated circuit substrate.

* * * * *